United States Patent
Yang et al.

(10) Patent No.: US 7,443,003 B2
(45) Date of Patent: Oct. 28, 2008

(54) SHAPE MEMORY ALLOY INFORMATION STORAGE DEVICE

(75) Inventors: Jihui Yang, Lakeshore (CA); Dexter D. Snyder, Birmingham, MI (US); Yang-Tse Cheng, Rochester Hills, MI (US)

(73) Assignee: GM Global Technology Operations, Inc., Detroit, MI (US)

( * ) Notice: Subject to any disclaimer, the term of this patent is extended or adjusted under 35 U.S.C. 154(b) by 560 days.

(21) Appl. No.: 11/248,349

(22) Filed: Oct. 12, 2005

(65) Prior Publication Data

US 2007/0081444 A1 Apr. 12, 2007

(51) Int. Cl.
*G11B 3/00* (2006.01)
(52) U.S. Cl. .............................. 257/415; 257/E45.001; 977/833; 977/874; 977/943
(58) Field of Classification Search ................. 257/415, 257/E45.001; 369/272.1; 977/833, 874, 977/943
See application file for complete search history.

(56) References Cited

U.S. PATENT DOCUMENTS

| | | | | |
|---|---|---|---|---|
| 4,922,462 | A * | 5/1990 | Ikegawa et al. | 365/113 |
| 5,728,240 | A | 3/1998 | Yamamoto et al. | |
| 6,084,849 | A | 7/2000 | Durig et al. | |
| 6,092,465 | A | 7/2000 | Agronin | |
| 6,392,915 | B1 * | 5/2002 | Anson et al. | 365/118 |
| 6,705,868 | B1 | 3/2004 | Schleppenbach et al. | |
| 6,773,535 | B1 | 8/2004 | Wetzel | |
| 2007/0163686 | A1 * | 7/2007 | Zhang et al. | 148/563 |

OTHER PUBLICATIONS

Shaw et al., "Thermomechanical High-Density Data Storage in a Metallic Material Via the Shape-Memory Effect", Apr. 25, 2005, Adv. Mater., 17, 1123-1127.*
Marsh, G., "Data Storage Gets to the Point," Materialstoday, Feb. 2003, pp. 38-43.
Vettiger, P., Cross, G., Despont, M., Drechsler, U., Durig, U., Gotsmann, B., Haberle, W., Lantz, M.A., Rothuizen, H.E., Stutz, R., and G.K. Binnig, "The "Millipede"—Nanotechnology Entering Data Storage," IEEE Transactions on Nanotechnology, vol. 1, No. 1, Mar. 2002, pp. 39-55.
Rediniotis, O.K., Lagoudas, D.C., Jun, H.Y., and R.D. Allen, "Fuel-Powered Compact SMA Actuator," Smart Structures and Materials 2002: Industrial and Commercial Applications of Smart Structures Technologies, Proc. SPIE vol. 4698, p. 441-453 (Jul. 2002).
Pozidis, H., Haberle, W., Wiesmann, D., Drechsler, U., Despont, M., Albrecht, T.R., and E. Eleftheriou, "Demonstration of Thermomechanical Recording at 641Gbit/in2," IEEE Transactions on Magnetics, vol. 40, No. 4, Jul. 2004, pp. 2531-2536.
Harman, T.C., Taylor, P.J., Walsh, M.P., and B.E. LaForge, "Quantum Dot Superlattice Thermoelectric Materials and Devices," Science vol. 297, Sep. 27, 2002, pp. 2229-2232.

(Continued)

*Primary Examiner*—Richard Elms
*Assistant Examiner*—Michael Lulis

(57) ABSTRACT

An information storage device includes a substrate and a shape memory alloy film established on the substrate. The shape memory alloy film may receive, supply, and store digital information. One or more thermoelectric modules is/are nanoimprinted between the substrate and the shape memory alloy film. The thermoelectric modules(s) is adapted to selectively erase at least some of the digital information from the shape memory alloy film.

19 Claims, 1 Drawing Sheet

OTHER PUBLICATIONS

Venkatasubramanian, R., Siivola, E., Colpitts, T., and B. O'Quinn, "Thin Film Thermoelectric Devices With High Room-Temperature Figures of Merit," Nature, vol. 413, Oct. 11, 2001, pp. 597-602.

Venkatasubramanian, R., O'Quinn, B., Siivola, E., Coonley, K., Addepally, P., Napier, M., and T. Colpitts, "Superlattice Thin-Flim Thermoelectric Materials and Devices," Mat. Res. Soc. Symp, Proc., vol. 793, 2004, pp. S2.3.1-S2.3.9.

Shaw, G.A., Stone, D.S., Johnson, A.D., Ellis, A.B., and W.C. Crone, "Shape Memory Effect in Nanoindentation of Nickel-Titanium Thin Film," Applied Physics Letters, vol. 83, No. 2, Jul. 14, 2003, pp. 257-259.

Lammers, D. "Nanoimprint Lithography Ready to Make its Mark," EE Times, Dec. 20, 2002.

Forbes/Wolfe, "Will Nanotech Preserve Moore's Law?," Nanotech Report, vol. 2, No. 2, Sep. 2003, pp. 1-2.

Symposium W, "Mechanically Active Materials," see Online Publications at www.mrs.org as vol. 855E of the Materials Research Society Symposium Proceedings Series.

* cited by examiner

SHAPE MEMORY ALLOY INFORMATION STORAGE DEVICE

TECHNICAL FIELD

The present disclosure relates generally to information storage devices, and more particularly to information storage devices having thermoelectric modules.

BACKGROUND

Shape memory alloys (SMA) have been applied to a wide variety of applications, in part, because of their ability to undergo a reversible phase transformation. It has been shown that the thermally induced martensitic transformation of indented SMA films allows for almost complete indent recovery on the nanoscale. If such a film were to be used as an information storage medium, erasing and rewriting information on the film would generally involve fast heating and cooling of the SMA, so that the temperature of the indents would move above and below the martensitic transformation temperature of the SMA. However, passive cooling would not likely achieve the desired temperature response. Further, such cooling would not allow for localized removal of stored information.

As such, it would be desirable to provide a high density information storage device having the capability for relatively rapid, localized heating and cooling.

SUMMARY

The present disclosure substantially solves the problems and/or drawbacks described above by providing an information storage device with relatively high storage density and relatively high-speed re-writability. The information storage device includes a substrate and a shape memory alloy film established on the substrate. The shape memory alloy film may receive, supply, and store digital information. One or more thermoelectric modules is/are nanoimprinted between the substrate and the shape memory alloy film. The thermoelectric module(s) is adapted to selectively erase at least some of the digital information from the shape memory alloy film.

BRIEF DESCRIPTION OF THE DRAWINGS

Objects, features and advantages of embodiments of the present disclosure may become apparent upon reference to the following detailed description and drawings, in which.

DESCRIPTION OF THE EMBODIMENTS

Embodiments of the present disclosure advantageously combine nanoindentation, a shape memory alloy film, and thermoelectric modules in an information storage device. It is believed that the combination of nanoindentation, the SMA film, and the thermoelectric modules allows for high-density storage and for rapid erasure and rewritability of digital information.

Figure 1:
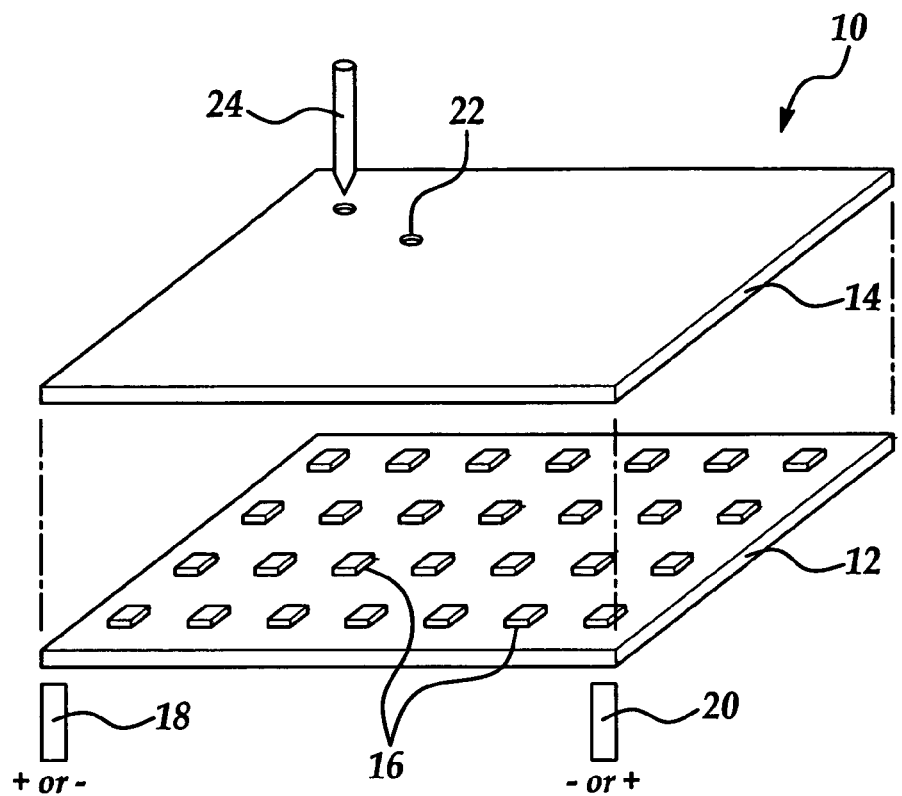
FIG. 1 is an exploded, semi-schematic perspective view of an embodiment of the information storage device.

Referring now to FIG. 1, an embodiment of the information storage device 10 is depicted. The device 10 generally includes a substrate 12, a shape memory alloy (SMA) film 14 established on the substrate 12, and one or more thermoelectric modules 16 nanoimprinted between the substrate 12 and the SMA film 14.

It is, to be understood that any suitable substrate 12 that is capable of having thermoelectric modules nanoimprinted thereon may be selected. In an embodiment, the substrate 12 is silicon.

As depicted, one or more thermoelectric modules 16 may be nanoimprinted on the substrate 12. It is to be understood that any suitable nanoimprinting process may be used to establish the module(s) 16. A non-limiting example of such a process includes electron-beam lithography. It is to be further understood that the thermoelectric modules 16 may be nanoimprinted in any desired pattern and/or configuration on the substrate 12 surface. Further, the thermoelectric module(s) 16 may have any suitable thickness.

In an embodiment, the thermoelectric module(s) 16 is established as a thin-film module. Generally, the thin-film thermoelectric module 16 is established on a substrate 12, and module 16 may generally have a thickness ranging from about one tenth of a micrometer to about ten micrometers.

As will be described in further detail hereinbelow, the thermoelectric module(s) 16 is adapted to selectively erase, either locally or globally, digital information that is stored in the SMA film 14. As such, the thermoelectric modules 16 may have electrical leads 18, 20 operatively connected thereto, such that electrical current may be supplied thereto. The electrical current advantageously assists in erasure of the stored information.

The shape memory alloy film 14 is established on the substrate 12 such that it substantially contacts the substrate 12 and any thermoelectric modules 16 nanoimprinted thereon. Any suitable shape memory alloy may be used. In an embodiment, the SMA film 14 contains at least one of aluminum-based alloys, iron-based alloys, copper-based alloys, nickel-based alloys, and mixtures thereof.

Any suitable deposition technique may be used to establish the SMA film 14. Non-limitative examples of such deposition techniques include physical vapor deposition (non-limitative examples of which include sputtering, pulsed laser deposition, and the like), chemical vapor deposition, electrochemical deposition, electroless deposition, and/or combinations thereof.

The SMA film 14 is capable of receiving, supplying, and/or storing digital information 22. In an embodiment, the digital information 22 is supplied to the SMA film 14 via a nanoindenting device 24. It is to be understood that the nanoindenting device 24 may also be used, for example, in a mapping mode, to retrieve stored data from various locations on the SMA film 14. In a non-limitative example, the SMA film 14 has a storage density ranging from about seven hundred Gbit/in$^2$ to about nine hundred Gbit/in$^2$.

Figure 2:
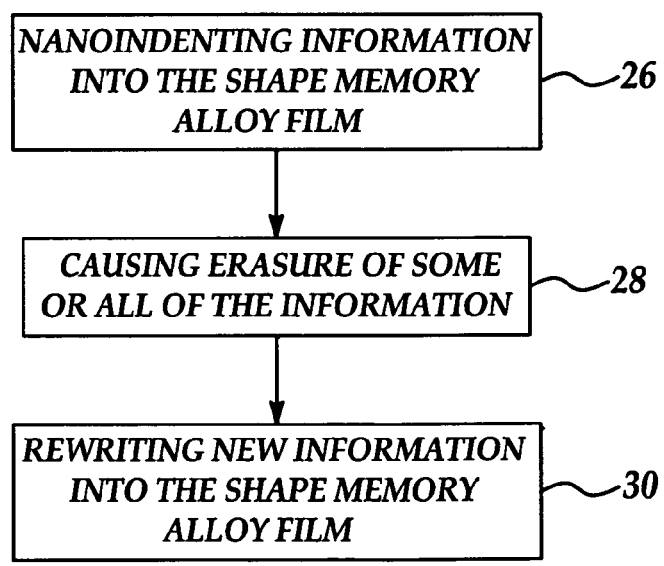
FIG. 2 is a flow diagram depicting an embodiment of the method of utilizing an embodiment of the information storage device.

Referring now to FIG. 2, an embodiment of a method of utilizing the device 10 is depicted. Generally, the method includes nanoindenting information 22 into the SMA film 14 (as described hereinabove), as depicted at reference numeral 26, and causing erasure of some or all of the information 22 from the SMA film 14, as depicted at reference numeral 28. The method may further include-rewriting new information into the SMA film 14, as depicted at reference numeral 30.

More specifically, erasing some or all of the information 22 from the SMA film 14 is accomplished by selectively supplying an electrical current of a polarity to one or more of the thermoelectric modules 16 nanoimprinted on the substrate 12. The electrical current of a polarity may be transmitted, to the thermoelectric module(s) 16 via the operatively connected electrical leads 18, 20. It is to be understood that information 22 is erased at an area of the SMA film 14 adjacent the thermoelectric module(s) 16 that receives the current of a pre-determined polarity. As such, information 22 may be erased locally or globally, depending, at least in part, on which thermoelectric module(s) 16 receive the electrical current of a polarity.

The method may optionally include rewriting new information into the SMA film 14. Rewriting may be accomplished by first selectively supplying an electrical current of an opposite polarity to the same thermoelectric module(s) 16 that received the electrical current of a polarity. The electrical current of the opposite polarity may be supplied to the thermoelectric module(s) 16 via the operatively connected electrical leads 18, 20. This will substantially ensure that the local temperature of the SMA film 14 is rapidly cooled below the martensitic transition temperature. The SMA film 14 may then be nanoindented with new information.

It is to be understood that the thermoelectric module(s) 16 are capable of undergoing the Peltier effect. In a Peltier circuit, an electrical current of a polarity may be applied in one direction, and as a result, one side of the circuit creates heat while the other absorbs heat. It is to be understood that switching the polarity of the current creates the opposite effect. Heating and cooling of the thermoelectric module(s) 16 occurs relatively rapidly. It is to be understood that the SMA film 14 adjacent the thermoelectric module(s) 16 is consequently rapidly heated or cooled when the thermoelectric modules 16 receive electrical current of a predetermined polarity. As such, erasing stored information 22 and rewriting new information in the SMA film 14 may be accomplished at a relatively rapid rate. In a non-limitative example, erasing and rewriting may be accomplished within a time frame ranging from about one microsecond to about nine hundred microseconds. Generally, passive cooling in an ambient environment takes from about 3 minutes to about 5 minutes before the temperature of the SMA cools below the martensitic transition temperature, when rewriting may occur.

Embodiments of the device and method(s) include, but are not limited to the following advantages. The combination of nanoindentation, the SMA film 14, and the thermoelectric modules 16 allows for high-density storage and for rapid erasure and rewritability of digital information 22.

While several embodiments have been described in detail, it will be apparent to those skilled in the art that the disclosed embodiments may be modified. Therefore, the foregoing description is to be considered exemplary rather than limiting.

The invention claimed is:

1. An information storage device, comprising:
   a substrate;
   a shape memory alloy film established on the substrate, wherein the shape memory alloy film is adapted to at least one of receive, supply, and store digital information; and
   at least one thermoelectric module nanoimprinted between the substrate and the shape memory alloy film, the at least one thermoelectric module adapted to selectively erase at least some of the digital information from the shape memory alloy film.

2. The device as defined in claim 1 wherein the shape memory alloy film receives digital information via a nanoindenting device.

3. The device as defined in claim 1 wherein the at least one thermoelectric module is a thin-film thermoelectric module.

4. The device as defined in claim 1 wherein the at least one thermoelectric module is adapted to substantially sequentially and selectively receive electrical current of one polarity and then of an opposite polarity.

5. The device as defined in claim 1 wherein the shape memory alloy film contains at least one of aluminum-based alloys, iron-based alloys, copper-based alloys, nickel-based alloys, and mixtures thereof.

6. The device as defined in claim 1 wherein the shape memory alloy film has a storage density ranging from about seven hundred Gbit/in$^2$ to about nine hundred Gbit/in$^2$.

7. A method for erasing information from an information storage device having information nanoindented in a shape memory alloy film, the method comprising supplying an electrical current of a polarity to at least one thermoelectric module, the at least one thermoelectric module nanoimprinted on a substrate and disposed between the substrate and the shape memory alloy film, wherein the electrical current causes erasure of the information at an area of the shape memory alloy film adjacent the at least one thermoelectric module that receives the electrical current.

8. The method as defined in claim 7 wherein the information storage device comprises a plurality of thermoelectric modules and wherein the electrical current is selectively supplied to at least some of the plurality of thermoelectric modules.

9. The method as defined in claim 8 wherein the electrical current is supplied to each of the plurality of thermoelectric modules, thereby erasing substantially all of the information stored in the shape memory alloy film.

10. The method as defined in claim 7 wherein the shape memory alloy film is at least one of heated and cooled when the at least one thermoelectric module receives electrical current of a predetermined polarity.

11. The method as defined in claim 7 wherein after erasing, the method further comprises rewriting information into the shape memory alloy film by supplying an electrical current of an opposite polarity to the at least one thermoelectric module, and then nanoindenting the shape memory alloy film with new information.

12. The method as defined in claim 7 wherein supplying the electrical current is accomplished by transmitting current to the at least one thermoelectric module from at least one electrical lead operatively connected thereto.

13. A method for utilizing an information storage device having at least one thermoelectric module nanoimprinted between a substrate and a shape memory alloy film, the method comprising:
   nanoindenting information into the shape memory alloy film; and
   causing erasure of at least some of the information at an area of the shape memory alloy film adjacent the at least one thermoelectric module by supplying an electrical current of a polarity to the at least one thermoelectric module.

14. The method as defined in claim 13, further comprising rewriting new information into the shape memory alloy film by supplying an electrical current of an opposite polarity to the at least one thermoelectric module, and then nanoindenting the shape memory alloy film with the new information.

15. The method as defined in claim 14 wherein supplying the electrical current of a polarity and supplying the electrical current of an opposite polarity is accomplished by transmitting current to the at least one thermoelectric module from at least one electrical lead operatively connected thereto.

16. The method as defined in claim 14 wherein an area of the shape memory alloy film adjacent the at least one thermoelectric module is heated or cooled when the at least one thermoelectric module receives electrical current of a predetermined polarity.

17. The method as defined in claim 14 wherein the information storage device comprises a plurality of thermoelectric modules, and wherein at least one of the electrical current of a polarity and the electrical current of an opposite polarity is selectively supplied to at least some of the thermoelectric modules.

18. The method as defined in claim 14 wherein erasing and rewriting occur within a time frame ranging from about one microsecond to about nine hundred microseconds.

19. The method as defined in claim 13 wherein prior to causing erasure, the method further comprises operatively connecting electrical leads to the at least one thermoelectric module.

* * * * *